United States Patent
Song et al.

(10) Patent No.: US 11,063,424 B2
(45) Date of Patent: Jul. 13, 2021

(54) ADAPTIVE PROTECTION METHOD FOR IMPEDANCE OF PARALLEL CAPACITORS

(71) Applicants: NR ELECTRIC CO., LTD, Jiangsu (CN); NR ENGINEERING CO., LTD, Jiangsu (CN)

(72) Inventors: Zhongpeng Song, Jiangsu (CN); Li Ding, Jiangsu (CN); Qunbing Yu, Jiangsu (CN); Zhen Jin, Jiangsu (CN); Shu Xu, Jiangsu (CN); Kaida Dong, Jiangsu (CN)

(73) Assignees: NR ELECTRIC CO., LTD, Jiangsu (CN); NR ENGINEERING CO., LTD, Jiangsu (CN)

( * ) Notice: Subject to any disclaimer, the term of this patent is extended or adjusted under 35 U.S.C. 154(b) by 136 days.

(21) Appl. No.: 16/470,957

(22) PCT Filed: Jul. 11, 2017

(86) PCT No.: PCT/CN2017/092430
§ 371 (c)(1),
(2) Date: Jun. 18, 2019

(87) PCT Pub. No.: WO2018/113271
PCT Pub. Date: Jun. 28, 2018

(65) Prior Publication Data
US 2020/0021104 A1    Jan. 16, 2020

(30) Foreign Application Priority Data
Dec. 20, 2016  (CN) .......................... 201611185611.3

(51) Int. Cl.
*G01R 27/26* (2006.01)
*H02H 7/16* (2006.01)
(Continued)

(52) U.S. Cl.
CPC ............. *H02H 7/16* (2013.01); *G01N 27/028* (2013.01); *G01R 27/26* (2013.01);
(Continued)

(58) Field of Classification Search
CPC ........ H02H 7/16; H02H 1/0007; G01R 27/26; G01R 31/40; G01R 27/2605; G01R 31/016; G01R 31/01; G01N 27/028; G05F 1/70
(Continued)

(56) References Cited

U.S. PATENT DOCUMENTS 3,909,672 A * 9/1975 Lundquist ................ H02H 7/16
                                                                                361/17
5,670,864 A * 9/1997 Marx ........................ G05F 1/70
                                                                                323/210
(Continued)

FOREIGN PATENT DOCUMENTS

CN    203871847 U    10/2014
CN    204964643 U    1/2016
(Continued)

OTHER PUBLICATIONS

ISA/CN, International Search Report dated Oct. 16, 2017, International Application No. PCT/CN2017/092430, 4 pages including English translation.

*Primary Examiner* — Danny Nguyen
(74) *Attorney, Agent, or Firm* — Masuvalley & Partners

(57) ABSTRACT

An adaptive protection method for impedance of parallel capacitors comprises monitoring a terminal voltage and current of the capacitor; automatically calibrating the initial impedance of the capacitor when the capacitor is put into operation; calculating a real-time impedance of the capacitor during operation, dynamically updating the actual impedance of the capacitor periodically; comparing the real-time
(Continued)

impedance of the capacitor with the actual impedance, updating the actual impedance if the relative value of the modulus of the real-time impedance change does not exceed the dynamic update limit threshold and the dynamic update reaches update period; generating an update failure alarm if the relative value of the modulus of the real-time impedance change exceeds the dynamic update limit threshold; generating a protection alarm if the relative value of the modulus of the real-time impedance change satisfies the protection alarm condition and the delay time is reached; and protecting the trip outlet if the relative value of the modulus of the real-time impedance change satisfies the protection trip condition and the delay time is reached. The protection method is applicable to various fault conditions of the capacitor and the capacitor bank, the set value is simple to calculate, the implementation is simple, and the sensitivity and reliability of the protection for capacitor are effectively improved.

13 Claims, 3 Drawing Sheets

(51) Int. Cl.
*G01N 27/02* (2006.01)
*H02H 1/00* (2006.01)
*G01R 31/01* (2020.01)
*G01R 31/40* (2020.01)
*G05F 1/70* (2006.01)

(52) U.S. Cl.
CPC ........... *H02H 1/0007* (2013.01); *G01R 31/01* (2013.01); *G01R 31/40* (2013.01); *G05F 1/70* (2013.01)

(58) Field of Classification Search
USPC ..................................................... 361/15–18
See application file for complete search history.

(56) References Cited

U.S. PATENT DOCUMENTS

2008/0291593 A1* 11/2008 Day ......................... H02H 7/06
361/78
2013/0128393 A1* 5/2013 Gajic ....................... H02H 7/16
361/15

FOREIGN PATENT DOCUMENTS

CN 105958621 A 9/2016
KR 10-1568942 B1 11/2015

* cited by examiner

ADAPTIVE PROTECTION METHOD FOR IMPEDANCE OF PARALLEL CAPACITORS

RELATED APPLICATIONS

This application is the U.S. National Phase of and claims priority to International Patent Application No. PCT/CN2017/092430, International Filing Date Jul. 11, 2017; which claims benefit of Chinese Patent Application No. 201611185611.3 filed Dec. 20, 2016; both of which incorporated herein by reference in their entireties.

TECHNICAL FIELD

The present invention relates to the relay protection for power system, in particular to a monitoring and protection method for parallel capacitors and parallel capacitor bank.

BACKGROUND

Parallel capacitors are widely used in power systems to provide reactive capacity for the system, they are frequently switched, and their safe operation is critical to the safety and stability of the power system. At present, the main protection method of parallel capacitors is unbalance protection. Unbalance protection is a protection scheme based on the principle of branch symmetry or three-phase symmetry of capacitor banks, and it is closely related to capacitor capacity, wiring method and capacitor component type, Subject to this restriction, it is unable to make selection freely; and needs to change the primary or the secondary wiring method or needs to increase the peripheral equipment. For example, when the single-star type capacitor bank uses the phase difference voltage protection, it is necessary to increase the tap of the discharge PT, and differential connection with secondary side of discharge PT; when the H-bridge capacitor bank is protected by bridge current, it is necessary to add a bridge current CT to the bridge arm.

Due to the characteristics of the unbalance protection, the protection sensitivity and reliability will be affected. For example, when the single-star capacitor bank uses open triangle voltage protection for the discharge PT, the unbalance voltage introduces the transmission error of the three-phase discharge PT, which expands the scope of errors and reduces the protection accuracy, and these initial unbalance values must be avoided during setting the protection value, so the sensitivity is greatly affected. However, even in this case, it is impossible to avoid the influence of some factors such as three-phase voltage asymmetry and harmonics in the operation system. Moreover, due to the characteristics of the unbalance protection, there must be a problem that the dead zone of the fault cannot be discriminated when a symmetrical fault occurs. Taking a double-star capacitor bank using a neutral point unbalance current protection as an example, when a capacitor unit breakdown occurs in the A-phase capacitor bank on both branches, the unbalanced voltages generated at the neutral points of the two branches are equal, the neutral point unbalance current is still zero, and the fault cannot be detected, no protection action will be performed.

It has been proposed to use the capacitor capacitance variation as a monitoring and protection scheme for the capacitor. As an energy storage component, the capacitor has a relatively fixed capacitance, which is not affected by the capacity, wiring method and component type. There is no need to avoid the initial unbalance, and no dead zone problem occurs. However, in actual operation, the capacitor capacity is not constant, it is affected by the higher harmonics in the system, and also affected by external environmental temperature, humidity and other factors. The capacitor bank is used as a complete set of equipment, its front end is connected with other devices such as reactors, so that the actual impedance is not completely equal to the capacitive reactance of the capacitor bank. When the fault occurs, not only the capacitance value is changed, but also a change in the resistance value can be found. Under certain conditions, the capacitance value may change little, and the resistance value may change greatly. Therefore, if the change of the capacitance value is used as an action criterion for protection, the sensitivity and reliability for protection will be greatly reduced in the actual application process.

SUMMARY

In view of the above problems, the present invention provides an adaptive protection method for impedance of parallel capacitors, which is simple to implement, adapts to various working conditions, and effectively improves capacitor protection accuracy and reliability for various fault conditions.

In order to implement the above method, the technical solution provided by the present invention is described as below:

monitoring a terminal voltage and current of the parallel capacitors; automatically calibrating the initial impedance of the capacitor when the capacitor is put into operation; calculating a real-time impedance of the capacitor during operation, dynamically updating the actual impedance of the capacitor periodically; comparing the real-time impedance of the capacitor with the actual impedance, updating the actual impedance if the relative value of the modulus of the real-time impedance change does not exceed the dynamic update limit threshold and the update period is reached; generating an update failure alarm if the relative value of the modulus of the real-time impedance change exceeds the dynamic update limit threshold; generating a protection alarm if the relative value of the modulus of the real-time impedance change satisfies the protection alarm condition and the delay time is reached; and protecting the trip outlet if the relative value of the modulus of the real-time impedance change satisfies the protection trip condition and the delay time is reached.

In the above solution, the terminal voltage and current of the capacitor are monitored; the terminal voltage of the capacitor is a vector difference between the bus voltage of each phase and the neutral point voltage of the capacitor, or is a terminal voltage of the discharge PT; the current is a current of each phase of the capacitor, or is a vector sum of the currents of each phase branch of the capacitor. The real-time impedance of the capacitor is calculated based on the monitored current and voltage of the capacitor.

In the above solution, the initial impedance of the capacitor is automatically calibrated when put into operation, wherein the calibration equation for the initial impedance is described as follows:

$$Z_{init\_(P)} = \frac{\dot{U}_{init\_(P)}}{\dot{I}_{init\_(P)}}$$

wherein, P refers to the three phases A, B, and C, $Z_{init\_(P)}$ is the initial impedance of each phase of the capacitor when put into operation, $\dot{U}_{init\_(P)}$ is a fundamental vector of initial voltage per phase of the capacitor when put into operation, and $\dot{I}_{init\_(P)}$ is a fundamental vector of initial current per phase of the capacitor when put into operation.

Furthermore, the automatically calibrated initial impedance of capacitor must meet the following requirements:

$$\varepsilon_{inh\_(P)} = \frac{|Z_{init\_(P)} - Z_{ideal}|}{|Z_{ideal}|} \times 100\%$$

$$\varepsilon_{inh\_(P)} < \varepsilon_{set\_alm\_inh}$$

wherein, $\varepsilon_{inh\_(P)}$ is a relative value of the modulus of inherent deviation of the initial actual impedance when put into operation; and $\varepsilon_{set\_alm\_inh}$ is a limit value of the relative value of the modulus of inherent deviation, $$Z_{ideal} = \frac{\dot{U}_n}{\dot{S}_n}$$

is a single-phase theoretical rated impedance of the capacitor; $\dot{U}_n$ is a rated line voltage, and $\dot{S}_n$ is the rated capacity.

Furthermore, if the above conditions are met, the calibration is accomplished, take $Z_{init\_(P)}$ as the actual impedance $Z_{real\_(P)}$ of the capacitor when put into operation. If the calibration fails, need to perform the calibration until it is accomplished, otherwise take the $Z_{ideal}$ as the actual impedance $Z_{real\_(P)}$.

In the above solution, during normal operation, the real-time impedance per phase of the capacitor and the relative value of the modulus of the real-time impedance change per phase of the capacitor are calculated as follows:

$$Z_{dyn\_(P)} = \frac{\dot{U}_{dyn\_(P)}}{\dot{I}_{dyn\_(P)}}$$

$$\varepsilon_{dyn\_(P)} = \frac{|Z_{dyn\_(P)} - Z_{real\_(P)}|}{|Z_{real\_(P)}|} \times 100\%$$

wherein, $Z_{dyn\_(P)}$ is a real-time impedance per phase of the capacitor, and $Z_{real\_(P)}$ is an actual impedance per phase of the capacitor, $\dot{U}_{dyn\_(P)}$ is a fundamental vector of the real-time terminal voltage per phase of the capacitor when put into operation, and $\dot{I}_{dyn\_(P)}$ is a fundamental vector of the real-time current per phase of the capacitor when put into operation, $\varepsilon_{dyn\_(P)}$ is a relative value of the modulus of the real-time impedance change per phase of the capacitor.

Furthermore, the actual impedance at the initial moment of operation results from the calibration. During normal operation, the actual impedance $Z_{dyn\_(P)}$ of the capacitor is updated periodically with the real-time impedance $Z_{real\_(P)}$ which satisfies requirements. If the update period is reached and the update condition is satisfied, the impedance change is considered to be a normal change, and the actual impedance $Z_{real}$ is updated; otherwise, the update fails and the actual impedance is not updated. The update condition is described as below:

$$\varepsilon_{dyn\_(P)} < \varepsilon_{set\_alm\_dyn}$$

$$\max(|\varepsilon_{dyn\_A} - \varepsilon_{dyn\_B}|, |\varepsilon_{dyn\_B} - \varepsilon_{dyn\_C}|, |\varepsilon_{dyn\_C} - \varepsilon_{dyn\_A}|) < \varepsilon_{set\_ub\_dyn}$$

wherein, $\varepsilon_{set\_alm\_dyn}$ is a limit value of the relative value of the modulus of the dynamic update impedance change, which is set according to the nominal temperature coefficient of the capacitor; $\varepsilon_{set\_ub\_dyn}$ is a limit value of the inconsistency relative value of the modulus of the change of the three-phase dynamic update, which is set according to the nominal inconsistency of the capacitor.

Furthermore, under the non-fault condition, i.e., normal operation, the dynamic change of the capacitor is small in a short time; and the dynamic update period T can be set according to the actual situation, namely:

$$T = t_{dyn\_set}$$

wherein, $t_{dyn\_set}$ is a set value of the dynamic update period for the actual impedance, the range of $t_{dyn\_set}$ is [0 h, 24 h], $t_{dyn\_set}=0$ means dynamic update.

In the above solution, in the event of a fault, if the relative value of the modulus of the real-time impedance change of the capacitor satisfies the protection alarm condition; and the delay time is reached, generating a protection alarm, and the protection alarm condition is:

$$\varepsilon_{dyn\_(P)} < \varepsilon_{set\_alm}$$

wherein, $\varepsilon_{set\_alm}$ is a value of the impedance protection alarm and is set to the relative value of the modulus of the real-time impedance change when the capacitor with sensitivity is faulty.

In the above solution, in the event of a fault, if the relative value of the modulus of the real-time impedance change of the capacitor satisfies the protection trip condition, and the delay time is reached, perform the protection for trip, and the protection trip condition is:

$$\varepsilon_{dyn\_(P)} > \varepsilon_{set\_trip}$$

wherein, $\varepsilon_{set\_trip}$ is a value of the impedance protection trip, and is set as the relative value of the modulus of the real-time impedance change when the number of fuses of the capacitor with sensitivity that are blown or broken down exceeds the allowable overvoltage multiple.

The present invention has the following beneficial effects: it is not affected by the capacitor voltage, the wiring mode and the component type, and is not affected by the system voltage level, the operation mode and the power quality, and is not affected by the monitoring system error or the sensing device error, and is not affected by the electromagnetic environment, external environment impacts such as weather and temperature, no additional primary or secondary equipment, no additional primary or secondary wiring complexity, suitable for various operating conditions, suitable for various fault conditions of capacitors and capacitor banks, simple calculation of the set value, easy to implement, and improved sensitivity and reliability of the protection for capacitor.

DESCRIPTION OF EMBODIMENTS

The invention will now be further described with reference to the accompanying drawings.

Take a parallel capacitor bank of 35 kV voltage level as an example, the capacitor bank model is TBB35-12000/

200AKW, the capacitor unit model BFM 11-200-1 W, the capacitor bank of each phase has 10 capacitors in parallel and 2 capacitors in series, the rated capacity of capacitor unit is 200 Kvar, the rated voltage is 11 kV and the capacitor unit is an external fuse capacitor.

Figure 3:
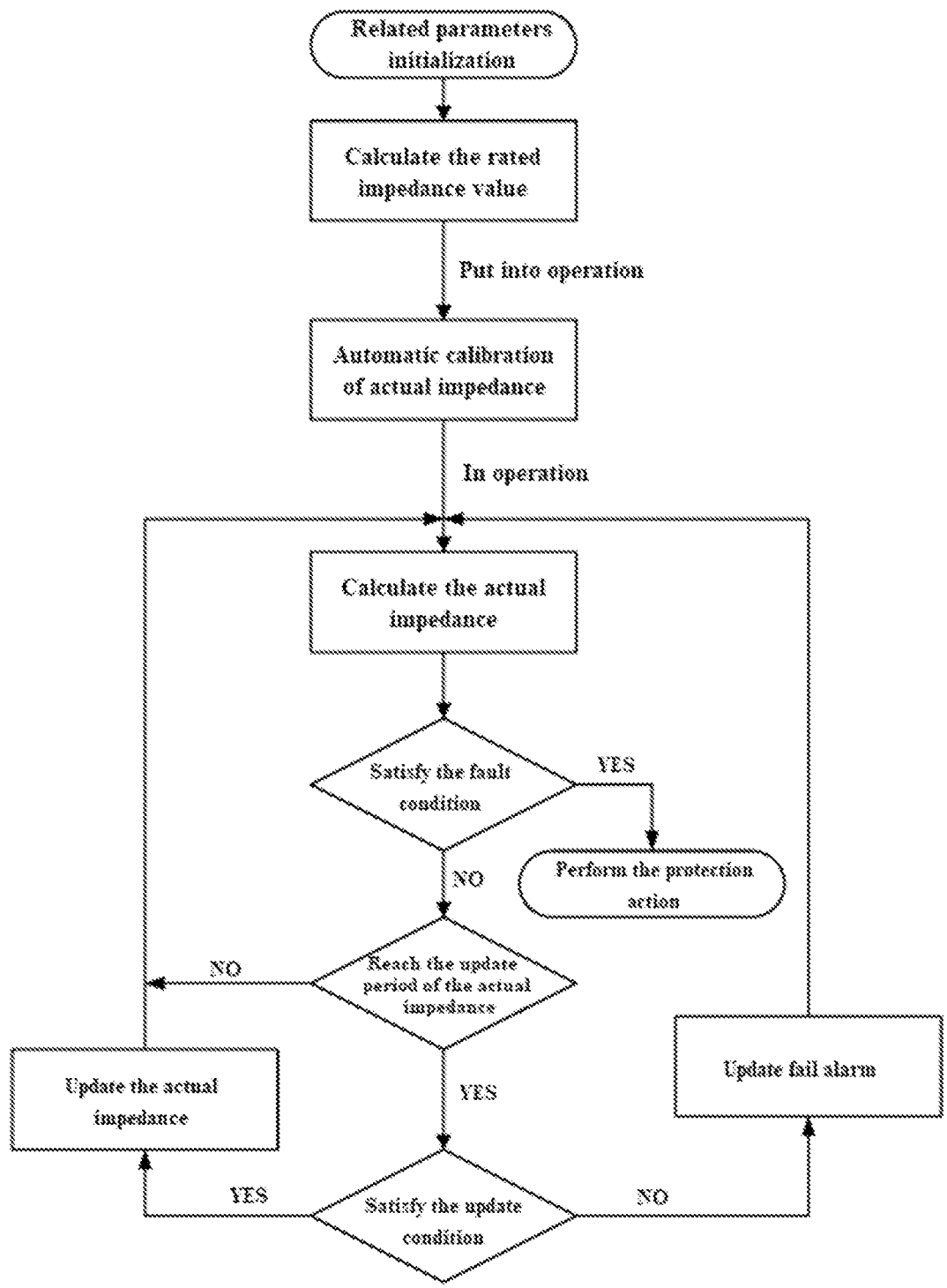
FIG. 3 is a flowchart of a protection embodiment of the present invention.

As shown in FIG. 3, an adaptive protection method for the impedance of parallel capacitor is implemented as follows:

(1) According to the set capacitor rated capacity, rated voltage and other parameters, pre-calculate the theoretical set impedance of capacitor:

$$Z_{ideal} = \frac{U_n^2}{S_n} = \frac{11000^2}{\frac{j20000 \times 5}{2}} = j242\Omega$$

wherein, $Z_{real}$ is a single-phase theoretical rated impedance of the capacitor, $U_n$ is a rated line voltage, and $S_n$ is a rated capacity.

(2) Set relevant equipment parameters and the protection set value;

The relationship between the number of external fuse units of the capacitor unit that are blown and the overvoltage multiple of the sound phase unit and the total impedance of each phase is calculated according to the number of capacitors connected in parallel and in series, as follows:

| The number of the fuse components that are blown | Overvoltage multiple of the sound phase unit | The modulus of the phase impedance (Ω) | The relative value of the modulus of the phase |
|---|---|---|---|
| 0 | 100 | 242 | 0 |
| 1 | 105.34 | 255.44 | 5.55 |
| 2 | 111.11 | 272.25 | 12.62 |
| 3 | 117.62 | 293.857 | 21.43 |

When 1 fuse of the capacitor is blown, the overvoltage multiple of the healthy component is 105.34%, which does not exceed 110%. Therefore, the capacitor is allowed to continue to work, and a fault warning is issued. When 2 fuses of the capacitor are blown, the overvoltage multiple of the component is 111.11%, the capacitor shall be tripped. Considering 1.5 times sensitivity to set the parameters as follows:

$\varepsilon_{set\_alm}=5.55/1.5=3.7$ $\varepsilon_{set\_trip}=(12.62-5.55)/1.5+5.55=10.26$ The protection alarm set value and the trip set value are set as follows:

| Number | Set Parameter | Set Value | Unit |
|---|---|---|---|
| 1 | Alarm Set Value $\varepsilon_{set\_alm}$ | 3.7 | % |
| 2 | Trip Set Value $\varepsilon_{set\_trip}$ | 10.26 | % |

According to the relevant provisions of "GB/T 11024.1-2010 parallel capacitors with nominal voltage more than 11.000V used for AC power system, Part 1: General", the set values are as follows:

| Number | Set Parameter | Set Value | Unit |
|---|---|---|---|
| 1 | Limit value of inherent deviation $\varepsilon_{set\_alm\_inh}$ | 6 | % |
| 2 | Limit value of dynamic update $\varepsilon_{set\_alm\_dyn}$ | 1 | % |
| 3 | Limit value of Three-phase inconsistency $\varepsilon_{set\_ub\_dyn}$ | 1 | % |
| 4 | Update period $t_{dyn\_set}$ | 1 | h |

(3) Monitor the terminal voltage and current of the capacitor; the voltage at the capacitor terminal can be the voltage difference between the bus voltage of each phase and the neutral point voltage of the capacitor, or is the terminal voltage of the discharge PT; the current is the current of each phase of the capacitor, or is the vector sum of the currents of each phase branch of the capacitor. The real-time impedance of the capacitor is calculated based on the monitored current and voltage of the capacitor.

(4) The initial impedance of the capacitor is automatically calibrated when put into operation, wherein the calibration equation for the initial impedance is described as follows:

$$Z_{init\_(P)} = \frac{\dot{U}_{init\_(P)}}{\dot{I}_{init\_(P)}}$$

wherein, P refers to the three phases A, B, and C, $Z_{init\_(P)}$ is the initial impedance of each phase of the capacitor when put into operation, $\dot{U}_{init\_(P)}$ is a fundamental vector of initial voltage per phase of the capacitor when put into operation, $\dot{I}_{init\_(P)}$ is a fundamental vector of initial current per phase of the capacitor when put into operation.

Figure 1:
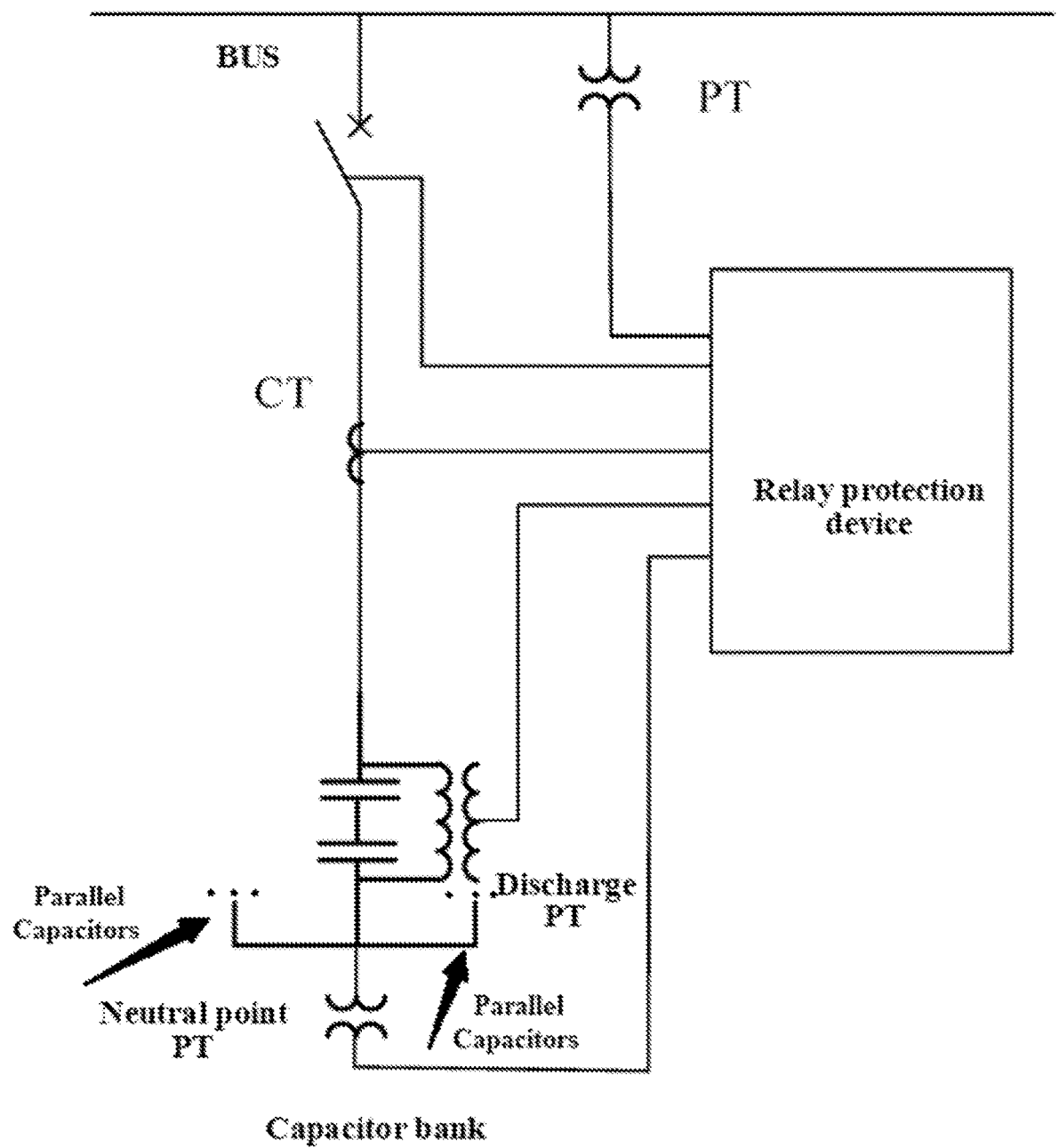
FIG. 1 is a schematic diagram of an application scenario of the present invention.
Figure 2:
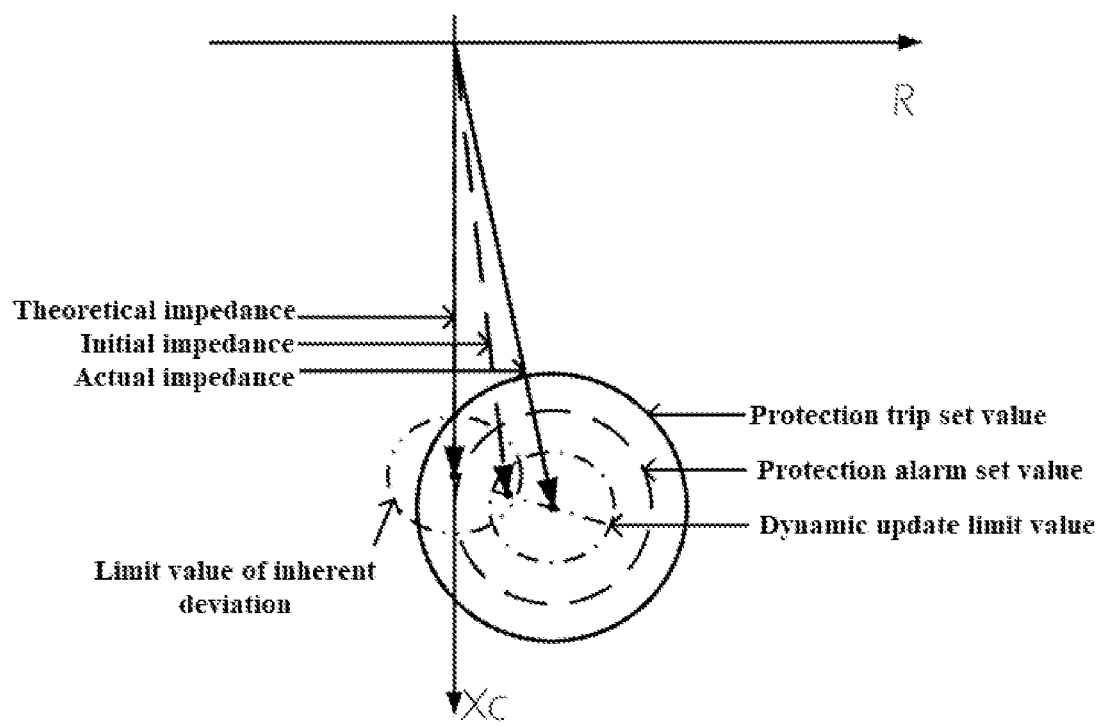
FIG. 2 is a schematic diagram of impedance circle for the impedance protection of parallel capacitors.

The calibrated initial impedance of capacitor must meet the following requirements:

$$\varepsilon_{inh\_(P)} = \frac{|Z_{init\_(P)} - Z_{ideal}|}{|Z_{ideal}|} \times 100\%$$

$$\varepsilon_{inh\_(P)} < \varepsilon_{set\_alm\_inh}$$

wherein, $\varepsilon_{inh\_(P)}$ is a relative value of the modulus of inherent deviation of the initial actual impedance when put into operation, and $\varepsilon_{set\_alm\_inh}$ is a limit value of the relative value of the modulus of inherent deviation, i.e., the radius of the auto-calibration alarm impedance circle in FIG. 2.

If the capacitor wiring works normally, and the sensor accuracy meets the requirements, the capacitor is automatically calibrated successfully.

(6) Then put into operation, in normal operation, calculate the real-time impedance of each phase of the capacitor and the relative change of the real-time impedance. The calculation equation is as follows:

$$Z_{dyn\_(P)} = \frac{\dot{U}_{dyn\_(P)}}{\dot{I}_{dyn\_(P)}}$$

$$\varepsilon_{dyn\_(P)} = \frac{|Z_{dyn\_(P)} - Z_{real\_(P)}|}{|Z_{real\_(P)}|} \times 100\%$$

wherein, $Z_{dyn\_(P)}$ is a real-time impedance per phase of the capacitor, and $Z_{real\_(P)}$ is an actual impedance per phase of the capacitor, $\dot{U}_{dyn\_(P)}$ is a fundamental vector of the real-time terminal voltage per phase of the capacitor when put into operation, and $\dot{I}_{dyn\_(P)}$ is a fundamental vector of the real-time current per phase of the capacitor when put into operation, $\varepsilon_{dyn\_(P)}$ is a relative value of the modulus of the real-time impedance change per phase of the capacitor.

(7) Determine whether the capacitor is faulty. When the real-time impedance of the capacitor meets the fault condition, if the delay time of capacitor is reached at this time, the capacitor is considered to be faulty and protect the trip. The protection condition is:

$$\varepsilon_{dyn\_(P)} < \varepsilon_{set\_alm\_dyn}$$

$$\frac{\max(|\varepsilon_{dyn\_A} - \varepsilon_{dyn\_B}|, |\varepsilon_{dyn\_B} - \varepsilon_{dyn\_C}|, |\varepsilon_{dyn\_C} - \varepsilon_{dyn\_A}|)}{\varepsilon_{set\_ub\_dyn}}$$

wherein, $\varepsilon_{set\_alm\_dyn}$ is a limit value of the relative value of the modulus of the dynamic update impedance change, i.e., the radius of the auto-calibration alarm impedance circle in FIG. 2; $\varepsilon_{set\_ub\_dyn}$ is a limit value of the inconsistency relative value of the modulus of the change of the three-phase dynamic update.

If the update condition is satisfied, the impedance change calculation result is considered as normal, and the actual impedance $Z_{real}$ is updated, otherwise the update is not updated and the update fails.

Under the non-fault condition, i.e., normal operation, the dynamic change of the capacitor is small in a short time, and the dynamic update period T can be set according to the actual situation, namely:

$$T = t_{dyn\_set}$$

The above embodiments are merely illustrative of the technical idea of the present invention, and the scope of protection of the present invention cannot be limited thereto, any technical changes made in accordance with the present invention or based on the technical solutions should fall within the scope of protection of the present invention.

What is claimed is:

1. An adaptive protection method for an impedance of parallel capacitors, characterized in that, the method comprising:
    monitoring a terminal voltage and current of the capacitors;
    automatically calibrating an initial impedance of the capacitors when the capacitors are put into operation;
    calculating a real-time impedance of the capacitors during operation, dynamically updating an actual impedance of the capacitors periodically;
    comparing the real-time impedance of the capacitors with the actual impedance, updating the actual impedance if a relative value of the modulus of the real-time impedance change does not exceed a dynamic update limit threshold and the dynamic update reaches an update period; generating an update failure alarm if the relative value of the modulus of the real-time impedance change exceeds the dynamic update limit threshold;
    generating a protection alarm if the relative value of the modulus of the real-time impedance change satisfies the protection alarm condition and a delay time is reached; and
    protecting a trip outlet if the relative value of the modulus of the real-time impedance change satisfies the protection trip condition and the delay time is reached.

2. The adaptive protection method for impedance of parallel capacitors according to claim 1, characterized in that, the terminal voltage and current of the capacitors are monitored; the terminal voltage of the capacitors is a vector difference between a bus voltage of each phase and a neutral point voltage of the capacitors, or is a terminal voltage of a discharge potential transformer; the current is a current of each phase of the capacitors, or is a vector sum of the currents of each phase branch of the capacitors.

3. The adaptive protection method for impedance of parallel capacitors according to claim 1, characterized in that, the protection trip condition of the impedance of the capacitors is calculated as follows:

$$\varepsilon_{dyn\_(P)} > \varepsilon_{set\_trip}$$

wherein, (P) refers to the three phases A, B, and C, $\varepsilon_{dyn\_(P)}$ is a relative value of the modulus of the real-time impedance change per phase when the capacitors fail, and $\varepsilon_{set\_trip}$ is a value of the impedance protection trip.

4. The adaptive protection method for impedance of parallel capacitors according to claim 1, characterized in that, the protection alarm condition of the impedance of the capacitors is calculated as follows:

$$\varepsilon_{dyn\_(P)} > \varepsilon_{set\_alm}$$

wherein, (P) refers to the three phases A, B, and C, $\varepsilon_{dyn\_(P)}$ is a relative value of the modulus of the real-time impedance change per phase when the capacitors fail, and $\varepsilon_{set\_alm}$ is a value of the impedance protection alarm.

5. The adaptive protection method for impedance of parallel capacitors according to claim 3, characterized in that, the relative value of the modulus of the real-time impedance change per phase of the capacitors is calculated as follows:

$$\varepsilon_{dyn\_(P)} = \frac{|Z_{dyn\_(P)} - Z_{real\_(P)}|}{|Z_{real\_(P)}|} \times 100\%$$

wherein, $Z_{dyn\_(P)}$ is a real-time impedance per phase of the capacitors, and $Z_{real\_(P)}$ is an actual impedance per phase of the capacitors.

6. The adaptive protection method for impedance of parallel capacitors according to claim 5, characterized in that, the actual impedance per phase of the capacitors is calculated as follows:

$$Z_{dyn\_(P)} = \frac{\dot{U}_{dyn\_(P)}}{\dot{I}_{dyn\_(P)}}$$

wherein, $\dot{U}_{dyn\_(p)}$ is a fundamental vector of the real-time terminal voltage per phase of the capacitors when put into operation, and $\dot{I}_{dyn\_(P)}$ is a fundamental vector of the real-time current per phase of the capacitors when put into operation.

7. The adaptive protection method for impedance of parallel capacitors according to claim 5, characterized in that, the actual impedance $Z_{dyn\_(P)}$ of the capacitors is updated periodically with the real-time impedance $Z_{real\_(P)}$ which satisfies requirements.

8. The adaptive protection method for impedance of parallel capacitors according to claim 7, characterized in that, the real-time impedance update period is set by the value of dynamic update period of the actual impedance.

9. The adaptive protection method for impedance of parallel capacitors according to claim 7, characterized in that, the dynamic period update of the actual impedance $Z_{real\_(P)}$ of the capacitors satisfies the condition as follows:

$$\varepsilon_{dyn\_(P)} < \varepsilon_{set\_alm\_dyn}$$

$$\max(|\varepsilon_{dyn\_A} - \varepsilon_{dyn\_B}|, |\varepsilon_{dyn\_B} - \varepsilon_{dyn\_C}|, |\varepsilon_{dyn\_C} - \varepsilon_{dyn\_A}|) < \varepsilon_{set\_ub\_dyn}$$

wherein, $\varepsilon_{set\_alm\_dyn}$ is a limit value of the relative value of the modulus of the dynamic update impedance change, and $\varepsilon_{set\_ub\_dyn}$ is a limit value of the inconsistency relative value of the modulus of the change of the three-phase dynamic update;

if the condition is satisfied, update the actual impedance; otherwise, the actual impedance is not updated and the dynamic update fails.

10. The adaptive protection method for impedance of parallel capacitors according to claim 5, characterized in that, the initial value of dynamic period update of the actual impedance $Z_{real\_(P)}$ of the capacitors is an actual impedance after automatic calibration when put into operation;

if the automatic calibration is accomplished, the actual impedance $Z_{real\_(P)}$ is an initial impedance $Z_{init\_(p)}$ of each phase after calibration of the capacitors when put into operation, otherwise the actual impedance $Z_{real\_(P)}$ is a single-phase theoretical rated impedance $$Z_{ideal} = \frac{\dot{U}_n}{\dot{S}_n}$$

of the capacitors; $\dot{U}_n$ is a rated line voltage, and $\dot{S}_n$ is a rated capacity.

11. The adaptive protection method for impedance of parallel capacitors according to claim 10, characterized in that, the initial impedance of the capacitors is automatically calibrated when put into operation, wherein the calibration equation for the initial impedance is described as follows:

$$Z_{init\_(P)} = \frac{\dot{U}_{init\_(P)}}{\dot{I}_{init\_(P)}}$$

wherein, $\dot{U}_{init\_(P)}$ is a fundamental vector of initial voltage per phase of the capacitors when put into operation, and $\dot{I}_{init\_(P)}$ is a fundamental vector of initial current per phase of the capacitors when put into operation.

12. The adaptive protection method for impedance of parallel capacitors according to claim 10, characterized in that, the initial impedance of the capacitors is automatically calibrated when put into operation, wherein the accomplishment of the automatic calibration is determined by the following:

$$\varepsilon_{inh\_(P)} < \varepsilon_{set\_alm\_inh}$$

wherein, $\varepsilon_{inh\_(P)}$ is a relative value of the modulus of inherent deviation of the initial actual impedance when put into operation, and $\varepsilon_{set\_alm\_inh}$ is a limit value of the relative value of the modulus of inherent deviation.

13. The adaptive protection method for impedance of parallel capacitors according to claim 12, characterized in that, the relative value of the modulus of inherent deviation of the initial actual impedance when put into operation is calculated by the following equation:

$$\varepsilon_{inh\_(P)} = \frac{|Z_{init\_(P)} - Z_{ideal}|}{|Z_{ideal}|} \times 100\%$$

* * * * *